(12) United States Patent  
Robeson et al.

(10) Patent No.: US 7,115,430 B2  
(45) Date of Patent: Oct. 3, 2006

(54) LIGHT EMITTING LAYERS FOR LED DEVICES BASED ON HIGH TG POLYMER MATRIX COMPOSITIONS

(75) Inventors: Lloyd Mahlon Robeson, Macungie, PA (US); Gary L. Johnson, Macungie, PA (US); William Franklin Burgoyne, Jr., Allentown, PA (US); Xuezhong Jiang, Breinigsville, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 62 days.

(21) Appl. No.: 10/987,723

(22) Filed: Nov. 12, 2004

(65) Prior Publication Data

US 2005/0070037 A1  Mar. 31, 2005

Related U.S. Application Data

(62) Division of application No. 10/253,108, filed on Sep. 23, 2002, now Pat. No. 6,818,919.

(51) Int. Cl.  
*H01L 21/00* (2006.01)

(52) U.S. Cl. ............................. 438/29; 438/30; 438/99; 257/40; 257/98; 252/301.34; 252/301.35

(58) Field of Classification Search ................. 438/29, 438/30, 99; 257/40, 98, E51.019, E51.018; 252/301.34, 301.35  
See application file for complete search history.

(56) References Cited

U.S. PATENT DOCUMENTS

| | | | |
|---|---|---|---|
| 4,769,292 A | 9/1988 | Tang et al. | 428/690 |
| 5,376,456 A | 12/1994 | Cumming et al. | 428/457 |
| 5,414,069 A | 5/1995 | Cumming et al. | 528/310 |
| 5,609,970 A | 3/1997 | Kolb et al. | 428/690 |
| 5,663,573 A | 9/1997 | Epstein et al. | 257/40 |
| 5,821,003 A | 10/1998 | Uemura et al. | 428/690 |
| 5,876,864 A | 3/1999 | Kim et al. | 428/690 |
| 5,900,327 A | 5/1999 | Pei et al. | 428/690 |
| 5,928,802 A | 7/1999 | Shi et al. | 428/690 |
| 5,952,778 A | 9/1999 | Haskal et al. | 313/504 |
| 6,030,550 A | 2/2000 | Angelopoulos et al. | 252/500 |
| 6,067,186 A | 5/2000 | Dalton et al. | 359/321 |
| 6,103,446 A | 8/2000 | Devlin et al. | 430/270.1 |
| 6,214,481 B1 | 4/2001 | Sakai et al. | 428/690 |
| 6,255,449 B1 | 7/2001 | Woo et al. | 528/401 |
| 6,277,504 B1 | 8/2001 | Koch et al. | 428/690 |
| 6,294,273 B1 | 9/2001 | Heuer et al. | 428/690 |
| 6,303,239 B1 | 10/2001 | Arai et al. | 428/690 |
| 6,329,082 B1 | 12/2001 | Kreuder et al. | 428/690 |
| 6,329,086 B1 | 12/2001 | Shi et al. | 428/690 |
| 6,514,632 B1 | 2/2003 | Woo et al. | |
| 6,597,012 B1 * | 7/2003 | Kido et al. | 257/40 |
| 6,818,919 B1 | 11/2004 | Robeson et al. | |
| 2001/0026879 A1 | 10/2001 | Chen et al. | |

OTHER PUBLICATIONS

Andersson, et al., "Substituted polythiophenes designed for optoelectronic devices and conductors", J. Mater Chem., 9, 1933-1940 (1999).

Pinto, et al., "Light-emitting copolymers of cyano-containing PPV-based chromophores and a flexible spacer", Polymer, 41, 2603-2611 (2000).

Kelly, "Flat Panel Displays. Advanced Organic Materials", Royal Society of Chemistry, 2000, pp. 155-177.

Shoustikov, et al., Electroluminescence Color Tuning by Dye Doping in Organic Light-Emitting Diodes, IEEE Journal of Selected Topics in Quantum Electronics, vol. 4, No. 1 (1998).

Djurovich, et al., "Ir(III) Cyclometalated Complexes as Efficient Phosphorescent Emitters in Polymer Blend and Organic LEDs", Polymer Preprints, 41(1), 770-771 (2000).

Chen, et al., "Bright White Polymer Double-Layer LEDs", Polymer Preprints 41(1), 835 (2000).

Hu, et al., "Bright Red Electroluminescence from a Dye/Copolymer Blend", J. Appl. Phys., 83(11) 6002 (1998).

Quaranta, et al., "Synthesis and characterization of dye-containing fluorinated polyimide thin films", Synthetic Metals, 124, 75-77 (2001).

Müller, et al., "Dye Containing Polymer Beads as Photonic Crystals", Polymer Preprints, 41(1), 810 (2000).

Sisk, et al., "Designing a better optoelectronic device", Chemical Innovation, May 2000.

Kocher, et al., "Patterning of Oriented Photofunctional Polymer Systems Through Selective Photobleaching**", Advanced Functional Materials, 11(1), 31 (2001).

Hwang, et al., "Synthesis and characterization of new poly(aryl ether)s containing alternate emitting and electron transporting chromophores", Polymer, 41, 6581-6587 (2000).

Hu, et al., "Electroluminescence of pure Poly(N-vinylcarbazole) and its blends with a multiblock copolymer", J. Appl. Phys., 76(4), 2419 (1994).

(Continued)

Primary Examiner—George R. Fourson  
Assistant Examiner—Julio J. Maldonado  
(74) Attorney, Agent, or Firm—Michael K. Boyer

(57) ABSTRACT

A light emitting device includes: (a) a light emitting layer including an electroluminescent organic material dispersed in a matrix, wherein the matrix contains a non-electroluminescent organic polymer having a $T_g$ of at least 170° C., and each of the organic polymer and the electroluminescent organic material constitutes at least 20 percent by weight of the light emitting layer; and (b) electrodes in electrical communication with the light emitting layer and configured to conduct an electric charge through the light emitting layer such that the light emitting layer emits light. A method for manufacturing a flexible organic light emitting device, includes providing the light emitting layer and providing electrodes above and below the light emitting layer, wherein the electrodes are in electrical communication with the light emitting layer.

20 Claims, 6 Drawing Sheets

OTHER PUBLICATIONS

Yang, et al., "Electroluminescence in Polymers", Macromol. Symp., 124, 83-87 (1997).

Frederiksen, et al., "Electroluminescence of Organic Thin Films based on Blends of Polystyrene and Fluorescent Dyes", J. Mater. Chem., 4(5), 675-678 (1994).

Pei, et al., Thiophene-Based Conjugated Polymers for Light-Emitting Diodes: Effect of Aryl Grups on Photoluminescence Efficiency and Redox Behavior, Marcromolecules 2001, 34, 7241-7248.

Liu, et al., Synthesis, Characterization, and Structure-Property Relationship of Novel Fluorene-Thiophene-Based Conjugated Copolymers, Marcromolecules 2000, 33, 8945-8952.

R. H. Partridge, Electroiuminescence from Polyvinylcarbazole Films: 4. Electroiuminescence Using Higher Work Function Cathodes, Polym., 24, 755 (1983).

R. H. Partridge, Electroluminescence From Polyvinylcarbazole Films: 3. Electroluminescent Devices, Polymer, 1983, vol. 24, 748-754.

Morin, et al., Blue-Light-Emitting Conjugated Polymers Derived From 2,7-Carbazoles, Macromol, Rapid Commun. 2002, 23, 1032-1036.

Spiliopoulos, et al., Blue-Light-Emitting Poly(phenylenevinylene)s with Alkoxyphenyl Substituents: Synthesis and Optical Properties, Macromolecules 2002, 35, 2149-2156.

Jang, et al., New Orange-Red Light Emitting Diode From Poly([2-(5-Cyclo-Hexyimethoxypentyloxy)-5-Methoxy-1, 4-Phenylenevinylene], Macromol. Chem. Phys. 200, 1101-1106 (1999).

Zheng, et al., Synthesis and Characterization to Fluorenediylvinlylene and Thiophenediylvinylene-Containing Terphenylene-Based Copolymers, Marcromolecules, 35, 9939 (2002).

Burn, et al., Chemical Tuning of the Electronic Properties of Poly(p-phenylenevinylene)-Based Copolymers, J. Am. Chem. Soc., 1993, 115, 10117-10124.

Ko, et al., Novel Poly(p-phenylenevinylene)s with an Electron-Withdrawing Cyanophenyl Group, Macromolecules 2002, 35, 6217-6223.

D. Neher, Polyfluorene Hompolymers: Conjugated Liquid-Crystalline Polymers for Bright Blue Emission and Polarized Electroluminescence, Macromol. Rapid Commun., 2001, 22, 1365-1385.

Johansson, et al., Synthesis and Characterization of Highly Soluble Phenyl-Substituted Poly(p-phenylenevinylenes), Macromolecules 2000, 33, 2525-2529.

\* cited by examiner

LIGHT EMITTING LAYERS FOR LED DEVICES BASED ON HIGH TG POLYMER MATRIX COMPOSITIONS

CROSS-REFERENCE TO RELATED APPLICATIONS

This application is a divisional of U.S. Ser. No. 10/253,108, filed Sep. 23, 2002, now U.S. Pat. No. 6,818,919 having the same title, which is incorporated herein by reference.

BACKGROUND OF THE INVENTION

This invention relates to organic electroluminescent devices and more specifically to light-emitting layer compositions.

Light emitting diode (LED) technology is expected to be a major opportunity for advanced materials development impacting a large number of future technology based applications. These include flat panel displays which offer significant advantages over liquid crystal displays (LCDs) including much lower power requirements, improved definition, broader viewing angles and faster response times. The technology for LEDs offers the potential for lower cost lighting sources compared to incandescent lighting as well as fluorescent lighting applications. Inorganic based LEDs are already replacing some of these conventional applications including traffic lighting as well as flashlights offering equal or improved lighting at much lower power requirements.

Small molecule organic light emitting diodes (SMOLEDs) are being commercialized to replace LCD displays based on lower power requirements, faster response times, better definition and also easier fabrication. Such SMOLEDs are expected to revolutionize the flat panel display technology. Another area receiving considerable interest involves polymeric light emitting diodes (PLEDs) where polymeric light emitting materials can be utilized for flexible organic light emitting diodes (FOLEDs). A significant advantage of polymeric materials involves the fabrication possibilities. FOLEDs offer the potential for ink-jet printing of flat panel displays on flexible substrates such as indium-tin oxide coated polymeric films (i.e. poly(ethylene terephthalate)(PET), oriented polypropylene or polycarbonate). Roll to roll printing processes could also be utilized for FOLEDs. The potential for FOLEDs is considered to be quite large offering unique flat or contoured display panels. These FOLEDs may be of interest for unique lighting applications and large screen displays. These displays would be low cost, easy to install, very thin and power efficient. An example could be a battery operated TV screen, which would be the thickness of several sheets of paper and capable of folding, at a cost commensurate with the fabrication simplicity. Of course many problems have to be solved before these possibilities become reality.

Development of PLEDs has focused on polymeric materials which exhibit electroluminescence. These materials are generally conjugated polymers, such as poly(phenylene vinylene), polyfluorenes, polyphenylenes, polythiophenes and combinations of such structures. Conjugated polymers for use in PLEDs are disclosed by a number of references. See, e.g., U.S. Pat. No. 5,247,190 to Friend et al., U.S. Pat. No. 5,900,327 to Pei et al. and Andersson et al., J. Mater Chem., 9, 1933–1940 (1999).

Variations of conjugated polymers useful for PLEDs include polymers comprised of oligomeric units of conjugated structures coupled into a high molecular weight polymer. See, e.g., U.S. Pat. No. 5,376,456 to Cumming et al., U.S. Pat. No. 5,609,970 to Kolb et al., Pinto et al., Polymer, 41, 2603–2611 (2000) and U.S. Pat. No. 6,030,550 to Angelopoulos et al.

A large number of low molecular weight compounds exist which exhibit fluorescence and electroluminescence. Some of these materials are commonly referred to as laser dyes. Many of these compounds offer very high fluorescence and thus electroluminescence. However, the properties desired for LED applications are generally only observed in solution or at low levels of doping in electro-optical or electroactive polymers. In the solid state, these materials can crystallize and lack the mechanical integrity to be utilized in PLEDs or SMOLEDs. Additionally (and more importantly), the excellent fluorescence and electroluminescence is lost with crystallization. These problems have been well documented in various reviews on the subjects of materials for LEDs. See, e.g., Kelly, "Flat Panel Displays. Advanced Organic Materials." (Royal Society of Chemistry, 2000) at pp.155 and 177. Consequently, a number of attempts have been made to solve these problems.

For example, U.S. Pat. No. 6,329,082 to Kreuder et al. discloses hetero-spiro compounds suitable for use in LED devices. The compounds purportedly overcome "the unsatisfactory film-forming properties and . . . pronounced tendency to crystallize" of conventional low molecular weight fluorescent materials.

U.S. Pat. No. 6,214,481 to Sakai et al. purports to address problems with low emission intensity in solution and thermal instability of OLEDs by providing an organic host compound (e.g., distyrylarylene derivatives) for a fluorescent substance, wherein the host compound has a fluorescent quantum efficiency of at least 0.3 in a solid state and a $T_g$ of at least 75° C.

Examples exist where fluorescent dopants are included in electroactive components of LEDs. See, e.g., Shoustikov et al., IEEE Journal of Selected Topics in Quantum Electronics, Vol. 4, No. 1 (1998), Djurovich et al., Polymer Preprints, 41(1), 770 (2000), Chen et al., Polymer Preprints 41(1), 835 (2000), U.S. Pat. No. 6,303,239 to Arai, U.S. Pat. No. 4,769,292 to Tang et al., U.S. Pat. No. 6,329,086 to Shi et al., U.S. Pat. No. 5,928,802 to Shi et al., and Hu et al., J. Appl. Phys., 83(11) 6002 (1998).

Examples also exist in the literature where fluorescent dyes have been added to non-active polymers for various applications. See, e.g., Quaranta et al., Synthetic Metals, 124, 75–77 (2001), Muller et al., Polymer Preprints, 41(1), 810 (2000), Sisk et al., Chemical Innovation, May 2000, U.S. Pat. No. 6,067,186 to Dalton et al., Kocher et al., Advanced Functional Materials, 11 (1), 31 (2001) and U.S. Pat. No. 5,952,778 to Haskal et al.

There are a number of examples in the literature where non-active polymers have been modified by side chain or main chain incorporation of optically active species. See, e.g., Hwang et al., Polymer, 41, 6581–6587 (2000), U.S. Pat. No. 5,414,069 to Cumming et al., U.S. Pat. No. 6,103,446 to Devlin et al., and U.S. patent application Publication US 2001/0026879 A1 to Chen et al.

U.S. Pat. No. 6,277,504 to Koch et al. discusses an electroluminescent assembly comprising a component which is a substituted or unsubstituted 1,3,5-tris(aminophenyl)benzene and a luminescent compound based on substituted metal complexed hydroxyquinoline compounds. The electroluminescent assembly can further comprise a polymeric binder. Similarly, U.S. Pat. No. 6,294,273 to Heuer et al. discloses a polymeric binder for the electroluminescent compound of a metal complex of N-alkyl-2,2'-imino-bis(8-hydroxy-quinoline).

Various references note blends of active electroluminescent polymers for utility in LED devices offering in many cases improved performance over the individual constituents. See, e.g., Hu et al., J. Appl. Phys., 76(4), 2419 (1994), and Yang et al., Macromol. Symp., 124, 83–87 (1997).

Blends of fluorene-based alternating polymer with non-active polymers (e.g. PMMA, epoxy resin, polystyrene) are disclosed in U.S. Pat. No. 5,876,864 to Kim et al. U.S. Pat. No. 6,255,449 to Woo et al. notes the utility of blends of specific fluorene containing polymers and a litany of other polymers, including conjugated polymers.

Frederiksen et al., J. Mater. Chem., 4(5), 675–678 (1994) teaches the addition of laser dyes to a polystyrene matrix for use in a LED device.

U.S. Pat. No. 5,821,003 to Uemura et al. notes the use of polymeric binders for low molecular weight hole transport materials for the hole transport layer of LED devices. Examples include polysulfone and aromatic tertiary amines. The inclusion of minor amounts of fluorescent compounds in the polymer bound hole transport layer is noted to improve the luminance of blue and white.

U.S. Pat. No. 5,663,573 discloses the use of a variety of organic light emitting materials for preparing a bipolar electroluminescent device, including polypyridines, polypyridylvinylenes, polythiophenes, polyphenylenes, polyphenylenevinylenes, polyphenylenebenzobisthiazoles, polybenzimidazobenzophenanthrolines, polyfluorenes, polyvinylcarbazoles, polynaphthalenevinylenes, polythienylenevinylenes, polyphenylene-acetylenes, polyphenylenediacetylenes and polycyanoterephthalylidenes.

Despite the foregoing developments, it is desired to incorporate the excellent properties of low molecular weight electroluminescent materials such as laser dyes as a material which could be utilized in a LED device with fabrication characteristics typically exhibited by PLEDs and the crystallization behavior characteristic of these materials effectively eliminated.

All references cited herein are incorporated herein by reference in their entireties.

BRIEF SUMMARY OF THE INVENTION

Accordingly, the invention provides a light emitting device comprising:
a light emitting layer comprising an electroluminescent organic material dispersed in a matrix, wherein the electroluminescent organic material has a molecular weight less than about 2000 amu, the matrix comprises a non-electroluminescent organic polymer having a $T_g$ of at least 170° C., and each of the non-electroluminescent organic polymer and the electroluminescent organic material constitutes at least 20 percent by weight of the light emitting layer; and
electrodes in electrical communication with the light emitting layer and configured to conduct an electric charge through the light emitting layer such that the light emitting layer emits light.

Further provided is a method for manufacturing a light emitting device, comprising providing the light emitting layer; and providing electrodes in electrical communication with the light emitting layer, wherein the electrodes are configured to conduct an electric charge through the light emitting layer such that the light emitting layer emits light.

BRIEF DESCRIPTION OF SEVERAL VIEWS OF THE DRAWINGS

The invention will be described in conjunction with the following drawings, wherein.

DETAILED DESCRIPTION OF THE INVENTION

Figure 1:
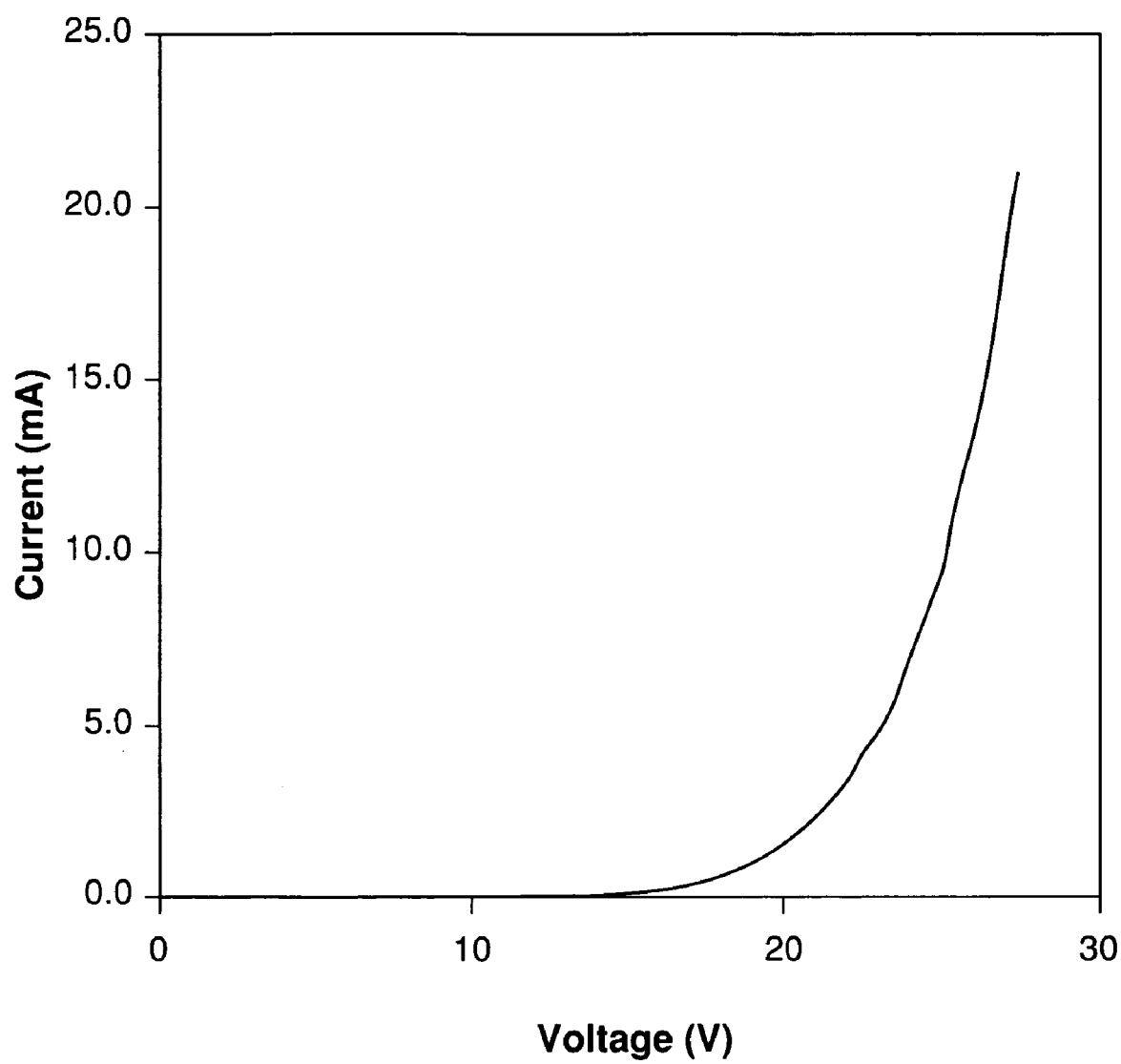
FIG. 1 is a graph of the current-voltage characteristic of Example 21.

It has been found that the incorporation of low molecular weight substances (which exhibit high fluorescence and thus electroluminescence) in high $T_g$ polymers allows for the preparation of thin films without crystallization of the low molecular weight substances. The resulting films exhibit high fluorescence and thus electroluminescence as solid materials. Lower $T_g$ polymers are inadequate for this application as the level of electroluminescent material incorporation will not be sufficient to yield the electroluminescent efficiency required due to the resultant $T_g$ of the polymer/electroluminescent material mixture being lower than that required for long term stability. For example, in the case of laser dyes, which are one class of low molecular weight electroluminescent materials, the rate of crystallization of the laser dyes (which characteristically exhibit crystallinity) is dependent upon the $T_g$ of the polymer/laser dye mixture. In the fabrication or use of FOLED devices, temperatures in excess of room temperature will certainly occur and if the $T_g$ of the polymer/laser dye is exceeded, crystallization of the laser dye could occur thus limiting the electroluminescent efficiency of the device. It has been found that high $T_g$ polymers can be utilized to prevent the crystallization of laser dyes even when the laser dye concentration is in excess of 50 wt. % based on the weight of the light emitting film.

Organic Polymers

The light emitting layer of the invention comprises an organic polymer having a $T_g$ of at least 170° C., preferably at least 200° C. Thus, the expression "high $T_g$ polymers" as used herein means polymers having a glass transition temperature of at least 170° C. The organic polymer preferably constitutes about 20 to about 80 wt. % of the light emitting layer, and in some of these preferred embodiments, constitutes about 40 to about 60 wt. % of the light emitting layer. The electroluminescent material needs to be 20 wt. % or higher in order to have a percolation pathway for transport of holes and electrons to the light emitting material. Lower levels do not allow for sufficient transport to yield desired electroluminescent results.

Suitable organic polymers include but are not limited to: polycarbonates based on aromatic bisphenols (at the lower limit of the $T_g$ requirement); polysulfones such as the polysulfone from 4,4'-dichlorodiphenylsulfone and Bisphenol A ($T_g$~180° C.), the poly(phenyl sulfone) from 4,4'-biphenol and 4,4'-dichlorodiphenylsulfone ($T_g$~220° C.) and other polysulfones based on various bisphenols and 4,4'- dichlorodiphenylsulfone, including poly(ether sulfone) from 4,4'-dihydroxydiphenylsulfone and ,4'-dichlorodiphenylsulfone ($T_g$~220° C.); polyimides such as the commercial product Ultem 1000 ($T_g$~220° C.) and variants thereof, and other polyimides (many having $T_g$'s well in excess of 220° C.) from dianhydrides (particularly from aromatic dianhydrides such as pyromellitic dianhydride, benzophenone dianhydride, diphenyl ether dianhydride and the like) and diamines (particularly from aromatic diamines such as 4,4'-diaminodiphenyl methane, 4,4'-diamino diphenyl ether and 4,4'-diamino diphenyl hexafluoroisopropylidene, p-phenylenediamine, m-phenylenediamine and the like).

A preferred class of high $T_g$ polymers comprises poly(aryl ether)s such as those described in U. S. Pat. Nos. 5,658,994 and 5,874,516. A particularly preferred polymer from this class of materials is the condensation polymer from the polymerization of 4,4'-dibromobiphenyl with 9,9-bis(4-hydroxyphenyl)fluorene.

In certain of these embodiments, the poly(arylene ether) comprises repeating units of the structure:

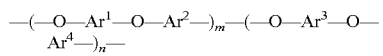

wherein m is 0 to 1, n is 1-m and $Ar^1$, $Ar^2$, $Ar^3$ and $Ar^4$ are independently divalent arylene radicals. In these embodiments, $Ar^1$, $Ar^2$, $Ar^3$ and $Ar^4$ are preferably divalent arylene radicals independently selected from the group consisting of:

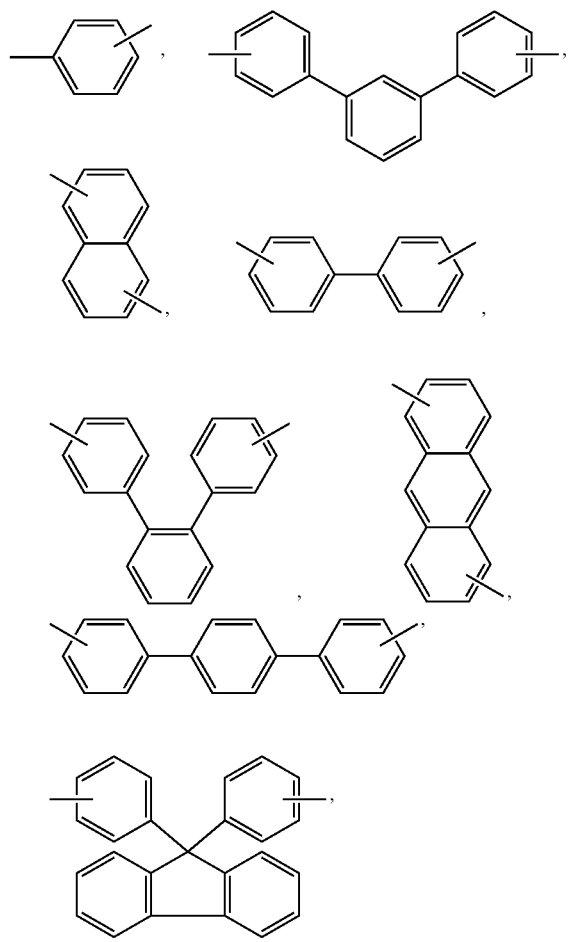

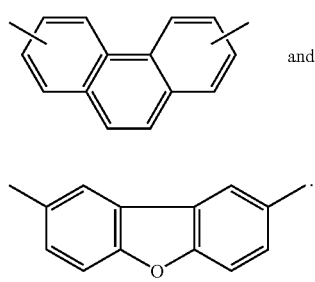

provided that $Ar^1$, $Ar^2$, $Ar^3$ and $Ar^4$ cannot be isomeric equivalents other than diradical 9,9-diphenylfluorene. In certain embodiments, m is 0.5 and n is 0.5. In certain other embodiments, m is 1 and $Ar^1$ is biphenyl radical.

An advantageous feature of poly(aryl ether)s (as well as certain other polymers) is the absence of functional groups (such as carbonyls) in the repeating units, which if present could result in quenching of the electroluminescence of the electroluminescent low molecular weight compounds included in the film. Another poly(aryl ether) of interest is poly(2,6-dimethyl-1,4-phenylene oxide) ($T_g$~210° C.) and similar structures with various substitution on the aromatic ring, provided the $T_g$ is equal to or greater than 170° C. Other poly(aryl ether)s discussed in a reference by Robeson et al. (in "Molecular Basis of Transitions and Relaxations", edited by Dale J. Meier, Gordon and Breach Science Publishers, New York, pp.405–425) are suitable for use in the present invention.

Another class of compounds suitable for use as organic polymers of the invention involve polyarylates such as those derived from bisphenols (such as Bisphenol A) and tere(iso) phthaloyl chlorides, as well as polyestercarbonates comprised of the above units of polyarylates and polycarbonates.

Electroluminescent Materials

The light emitting layer of the invention comprises an electroluminescent material dispersed in the organic polymer matrix. The electroluminescent materials of this invention are defined as materials that exhibit electroactive properties in electroluminescent applications, including the light emitting materials, the hole transport materials and the electron transport materials. The electroluminescent materials can be combinations of the electroactive species. In a preferred embodiment of this invention, the electroluminescent material is a combination of a hole transport material, a light emitting material and an electron transport material. Optionally, the electroluminescent material of this invention can be combinations of a hole transport material and a light emitting material or an electron transport material and a light emitting material. The electroluminescent material preferably constitutes about 20 to about 80 wt. % of the light emitting layer, and in some of these preferred embodiments, constitutes about 40 to about 60 wt. % of the light emitting layer. Lower levels of electroluminescent materials might not produce sufficiently intense electroluminescence, and higher levels can adversely impact the physical integrity of the resulting film.

Suitable electroluminescent materials must be miscible with the high $T_g$ polymers of the invention. This will provide increased $T_g$ (of the active species), greatly improved mechanical properties and film integrity, decreased crystallization rates, and the ability to be utilized in spin-on processing, ink-jet printing, and roll-to-roll printing processes. Suitable electroluminescent materials include but are not limited to fluorescent compounds such as laser dyes as well as other active organic species, including distyrenyl derivatives such as those described in U.S. Pat. Nos. 5,503, 910, 5,121,029 and 6,214,481.

The class of laser dyes includes but is not limited to Coumarin 6, Coumarin 334, Coumarin 343, Rhodamine B, Rhodamine 6G, Rhodamine 110, Fluorescein 548, 2',7'-dichlorofluorescein, cresyl violet perchlorate, Nile Blue AA perchlorate, p-terphenyl, p-quaterphenyl, Exalite (376, 384r, 389), Fluorol 555, Fluorescein Diacetate, Carbostyril 165, IR-140, Thionin, perylene, 9-amino acridine HCl and the like. Additional laser dyes include aromatic methylidine compounds of the general structure:

$R^1R^2C=CH-Ar-CH=CR^3R^4$ where $R^1$, $R^2$, $R^3$, and $R^4$ represent hydrogen, alkyl groups, alkoxy groups, aromatic groups including substituted aromatic groups, cycloaliphatic groups and the like; and Ar represents an aromatic structure including phenyl, biphenyl, terphenyl linked aromatic structures including various substituents on the aromatic group(s). The substituents can include alkyl, aryl, alkoxy, hydroxyl, halide, amino and the like. Such compositions are discussed in various patents issued to Idemitsu Kosan, including U.S. Pat. Nos. 5,503, 910, 5,121,029 and 6,214,481.

Quinacridones such as 9,18-dihydro-9,18-dimethylbenzo[h]benzo[7,8]quino[2,3-b]acridine-7,16-dione; 7,16-dihydro-7,16-dimethylbenzo[a]benzo[5,6]quino[3,2-l]acridine-9,18-dione; N,N'-dimethyl-quinacridone can also be employed as light emitting materials in the electroluminescent materials of this invention.

Linked aromatic structures such as 9,10-di-(2-naphthyl) anthracene derivatives as described in U.S. Pat. No. 5,935,721 can also be suitable for use as the electroluminescent material of the present invention. Light emitting naphthalene derivatives, anthracene derivatives, phenanthrenes, perylenes, chrysenes, butadienes (such as tetraphenylbutadiene) and the like are also suitable, as are periflanthenes as described in U.S. Pat. No. 6,004,685 and tetravinylpyrazines as described in U.S. Pat. No. 5,416,213.

Oligomers of conjugated polymers with molecular weights of less than 2000 amu, such as oligophenylenevinylene, oligophenylenevinylene, oligothiophenes such as α-quaterthiophene and α-hexathiophene, oligo(p-phenylene) and oligofluorenes can be suitable light emitting materials for the electroluminescent materials of this invention.

The hole transport materials which constitute one of the classes of electroluminescent materials of this invention include but are not limited to aromatic tertiary amines, benzidine, pyrazoline derivatives along with other classes of known hole transport materials. Suitable arylamine and benzidine derivatives include, e.g., N,N'-bis(3-methylphenyl)-N,N'-bis(phenyl)-benzidine, N,N'-bis(4-methylphenyl)-N,N'-bis(phenyl)-benzidine, N,N'-di(naphthalene-2-yl)-N,N'-diphenylbenzidine, 1,3,-5-tris(3-methyldiphenylamino)benzene; 4,4'-Bis(carbazol-9-yl) biphenyl; 4,4',4"-Tris(carbazol-9-yl)-triphenylamine (CAS #139092-78-7); N,N,N',N'-Tetrakis(3-methylphenyl)-benzidine; 4,4',4"-Tris(N-(2-naphthyl)-N-phenyl-amino)-triphenylamine; 4,4',4"-tris(N,N-diphenyl-amino)-triphenylamine. Suitable pyrazoline derivatives include, e.g., PYR-7 and PYR-9 disclosed by Takeshi Sano et al., *J. Mater. Chem.*, 2000,10 (1), 157–161:

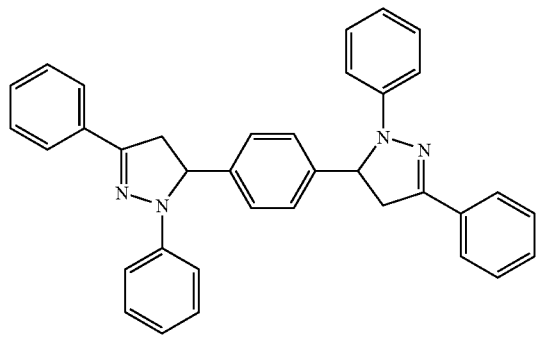

PYR-7

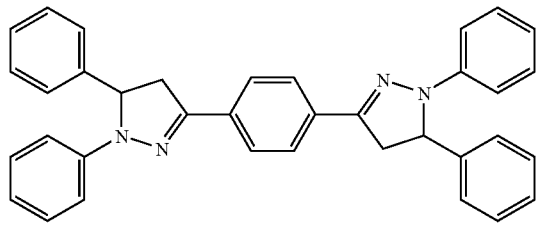

PYR-9 as well as oligothiophenes such as α-quaterthiophene and α-hexathiophene, dibenzochrysene derivatives, oligophenylenevinylenes, oligofluorenes, phthalocyanines and carbazole derivatives.

The electron transport materials, which constitute one of the classes of electroluminescent materials of this invention, include but are not limited to oxadiazole, triazole, phenanthroline, quinolinolato and benzoquinolinolato functional organics. Suitable examples of oxadiazole derivatives include, e.g., 2-(4-biphenylyl)-5-(p-tert-butylphenyl)-1,3,4-oxadiazole (PBD); 2,2'-(1,3-phenylene) bis[5-[4-(1,1-dimethylethyl)phenyl]]-1,3,4-oxadiazole (CAS #138372-67-5); and 1,3-Bis(4-(4-diphenylamino)-phenyl-1,3,4-oxidiazol-2-yl)-benzene (CAS #184101-39-1). Suitable examples of triazole derivatives (hole blocker-electron transporter) include, e.g., 3,4,5-triphenyl-1,2,4-triazole; 3,5-bis(4-tert-butyl-phenyl)-4-phenyl-1,2,4-triazole; and 3-(4-biphenylyl)-4-phenyl-5-tert-butylphenyl-1,2,4-triazole. Suitable examples of phenanthroline derivatives include, e.g., 2,9-dimethyl-4,7-diphenyl-1,10-phenanthroline (BCP; CAS #4733-39-5). Suitable examples of quinolinolato and benzoquinolinolato complexes include, e.g., tris(8-hydroxyquinolinolato)aluminum ($Alq_3$); bis(10-hydroxybenzo[h] quinolinolato)beryllium ($Bebq_2$); 2,2',2"-(1,3,5-benzenetriyl)tris-[1-phenyl-1H-benzimidazole] (TPBI); and cyano substituted oligophenylenevinylene derivatives.

Mixtures of two or more of the electroluminescent materials in the polymer matrix are contemplated to achieve specific colors or optionally to yield white light.

The molecular weight of the electroluminescent material is preferably less than 2000 amu (i.e., the electroluminescent material is preferably a low molecular weight substance). Higher molecular weight species would be expected to have limited miscibility with many of the higher $T_g$ polymers.

Light Emitting Device Structure

The construction of light emitting devices of the invention can be greatly varied. For example, suitable light emitting devices can have a transparent anode placed on one side of an appropriate substrate. A hole injection/transport layer is placed on top of the transparent anode and can comprise both a hole injection layer and a hole transport layer. On top of the hole transport layer is the light emitting layer where holes and electrons combine to emit light. On top of the light emitting layer is the electron injection/transport layer and on top of this layer the cathode is positioned. The anode, light emitting and cathode layers are required. The hole injection, hole transport, electron injection and electron transport layers are optional. In specific cases where the hole transport or electron transport is too rapid, hole or electron blocking layers can be provided to assure maximum electron-hole combination in the light emitting layer.

Typically the substrate coated with the anode is glass. Transparent polymer sheets and films can also be employed. These include, e.g., Bisphenol A polycarbonate, PMMA, poly(ethylene terephthalate) film, polysulfone films, polypropylene films and the like.

The transparent anode is preferably indium-tin oxide (ITO), tin oxide or doped zinc oxide. Conductive polymeric materials can be used as the anode or as a coating on the anode to improve hole injection. These include but are not limited to poly(3,4-ethylenedioxythiophene) doped with poly(styrene sulfonic acid) or other appropriate dopants and sulfonated polyaniline derivatives or polyaniline variants doped with strong organic acids.

The hole transport layer includes but is not limited to polyvinylcarbazole, aromatic tertiary amines and phthalocyanines. In certain embodiments, the hole transport layer can be comprised of low molecular weight compounds noted above in the discussion of electroluminescent materials along with higher molecular weight versions of similar compounds.

The electron transport/injection layer can comprise low molecular weight compounds such as the metal complexes of 8-hydroxyquinoline, triazoles or higher molecular weight polymers comprising oxadiazole, quinoxaline or triazole groups. In certain embodiments, the electron transport layer can be comprised of low molecular weight compounds noted above in the discussion of electroluminescent materials along with higher molecular weight versions of similar compounds.

The metal cathode can comprise at least one member selected from the group consisting of calcium, magnesium, aluminum, silver and indium. When more than one of the group members is present, they can be mixed or layered. Alloys with other metals can be employed and alkali or alkaline earth metals such as Cs and Li (as CsF and LiF) can be employed in minor amounts. The light emitting layer of this invention is preferably positioned between the hole injection/transport layer and the electron injection/transport layer in the foregoing preferred embodiment.

Alternatively, a single multifunctional layer can substitute for at least two of the hole injection/transport layer, the electron injection/transport layer and the light emitting layer. In certain embodiments of this invention, the hole transport, electron transport and light emitting materials can all be combined with the high $T_g$ polymer in the light emitting layer to thereby provide a single layer (between the electrodes) device. This offers significant fabrication advantages over multilayer devices. This specific feature of this embodiment of the invention is quite important, because of the importance of balancing hole and electron transport in a light emitting device so that the recombination of holes and electrons occurs at the proper position in the device. The combination of hole transport, electron transport and light emitting materials in the high $T_g$ polymer of this invention can facilitate optimization of the light emitting device.

In production of the light emitting device, the hole injection layer of a transparent conducting polymer (e.g., polyethylenedioxythiophene or PEDOT) can be applied via spin coating, spray coating, meniscus coating, screen printing, ink jet printing or roll-to-roll processing. Low molecular weight hole injection materials can be applied using sputtering or evaporative coating techniques. The hole transport layer can be applied by vacuum deposition as well as the other methods noted for the hole injection layer. The light emitting layer comprising high $T_g$ amorphous polymers with miscible low molecular weight electroluminescent materials can be applied from an appropriate solvent via spin coating, ink jet printing, screen printing or roll-to-roll printing processes. The electron transport/injection layer(s) can be applied via vacuum deposition or the methods noted for the light emitting layers. The cathode can be applied via sputtering or thermal vacuum evaporation/deposition techniques well known in the art as well as screen printing, ink-jet printing or roll-to-roll processing.

The specific construction of the light emitting device to deliver a multicolor display panel required for many potential applications involves pixel design such that red, green and blue light emitting pixels can be employed to provide a full color spectrum. An advantage of the combination of high $T_g$ polymers with low molecular weight electroluminescent species is that it allows for preventing migration of species from one pixel into neighboring pixels resulting in loss of color definition with time. This combination should lead to increased stability with high temperature exposure and should exhibit longer lifetimes without loss of luminescence or color definition.

A preferred LED device of this invention is a flexible flat panel display. As used herein, the term "flexible" means that the flexible object (e.g., flat panel display) can be placed on a cylindrical curvature of a cylinder having a radius of 6 inches without fracture of the device and without loss of its ability to exhibit light emission as in the flat state.

For the LED devices of this invention most of the compositions employed for the cathode materials will be sensitive to water and/or oxygen. Other layers and materials utilized in the construction could also be sensitive to water and oxygen exposure. For rigid devices, glass coatings on both sides with proper sealants to prevent water or oxygen diffusion into the device will suffice. For flexible devices, flexible barrier films will need to be employed. For the non-transparent side of the device, flexible barrier films such as metallized poly(ethylene terephthalate) could be employed. For the transparent side, flexible transparent barrier films could be utilized, such as in BARIX encapsulation coatings available from Vitex corporation, and in U.S. Pat. No. 6,268,695 to Affinito.

In preparing light emitting devices of the invention, it is preferred to purify the non-electroactive polymer and the solvents employed in the solution utilized to prepare the light emitting layer of the light emitting device. The removal of ionic species (e.g., $Na^+$, $Li^+$, $K^+$, $Ca^{++}$, $Mg^{++}$, $Cu^+$, $Cu^{++}$ and the like) as well as the counterions (e.g. $Cl^-$, $Br^-$, $SO_4^{--}$, $CO_3^{--}$, etc.) is preferred to assure the efficiency of the device as well as assure quality control of the light emitting layer from device to device. Coagulation of the polymer solution in a non-solvent followed by rinsing, extraction of ionic species using ion-exchange procedures, addition of chelation agents and the like are possible methods for reducing the contaminant levels to acceptable levels. The ionic contamination is a particular problem with many condensation polymers potentially employable in this invention.

The invention will be illustrated in more detail with reference to the following Examples, but it should be understood that the present invention is not deemed to be limited thereto.

EXAMPLES

The first series of examples to demonstrate this invention involved preparing dilute solutions of fluorescent dyes and high $T_g$ polymers in a common solvent. The samples (Examples 1–14) were prepared and modest heating (up to 80° C. for higher boiling solvents) was employed to improve solubility. Examples 1–14 are summarized in Table 1 below.

samples, a clean silica disk or glass slide was placed in the reference beam for dried film samples.

Photoluminescence spectra were measured using a Hitachi F-2000 fluorescence spectrometer with a high pressure Xe lamp source. Bandwidth was 10 nm on both exitation and emission spectrographs. Film samples were placed at 45 degrees to source and emission with front surface illumination.

Example 15

Construction and Testing of an LED Device

An unpolished float glass $SiO_2$ slide (50×75×1.1 mm) coated on one side with indium tin oxide (resistance=8–12

| Example | Ingredients | Property | Solution value (nanometers) | Film value (nanometers) |
|---|---|---|---|---|
| 1 | 0.1078 grams 5(6) carboxyfluorescein | Visible $\lambda_{max}$ | 394 | 460 |
|   | 0.3417 grams of polysulfone | Excitation $\lambda_{max}$ | 402 | 472 |
|   | 40 grams of NMP | Emission $\lambda_{max}$ | 513 | 528 |
| 2 | 0.2329 grams of 5(6) carboxyfluorescein | Visible $\lambda_{max}$ | 390 | 459 |
|   | 0.2309 grams of poly(phenyl sulfone) | Excitation $\lambda_{max}$ | 400 | 470 |
|   | 40 grams of NMP | Emission $\lambda_{max}$ | 510 | 526 |
| 3 | 0.1043 grams of Coumarin 343 | Visible $\lambda_{max}$ | 443 | 439 |
|   | 0.1546 grams of polysulfone | Excitation $\lambda_{max}$ | 446 | 440 |
|   | 40 grams of NMP | Emission $\lambda_{max}$ | 495 | 504 |
| 4 | 0.2408 grams of Coumarin 6 (Control) | Visible $\lambda_{max}$ | 464 | 452 |
|   | 40 grams of NMP | Excitation $\lambda_{max}$ | 472 | 475 |
|   |  | Emission $\lambda_{max}$ | 504 | 547 |
| 5 | 0.2550 grams of Coumarin 6 | Visible $\lambda_{max}$ | 464 | 452 |
|   | 0.2410 grams of PAE-2 | Excitation $\lambda_{max}$ | 470 | 470 |
|   | 40 grams of cyclopentanone | Emission $\lambda_{max}$ | 504 | 561 |
| 6 | 0.2482 grams of Coumarin 6 | Visible $\lambda_{max}$ | 464 | 452 |
|   | 0.2396 grams of poly(phenyl sulfone) | Excitation $\lambda_{max}$ | 470 | 470 |
|   | 40 grams of cyclopentanone | Emission $\lambda_{max}$ | 504 | 567 |
| 7 | 0.1705 grams of Rhodamine B | Visible $\lambda_{max}$ | 560 | 576 |
|   | 0.1520 grams of PAE-2 | Excitation $\lambda_{max}$ | 564 | 529 |
|   | 30 grams of cyclopentanone | Emission $\lambda_{max}$ | 588 | 605 |
| 8 | 0.1586 grams Rhodamine B | Visible $\lambda_{max}$ | 562 | 545 |
|   | 0.1707 grams polysulfone | Excitation $\lambda_{max}$ | 530 | 530 |
|   | 40 grams of NMP | Emission $\lambda_{max}$ | 592 | 595 |
| 9 | 0.1500 grams Rhodamine B | Visible $\lambda_{max}$ | 562 | 549 |
|   | 0.1546 grams poly(phenyl sulfone) | Excitation $\lambda_{max}$ | 530 | 530 |
|   | 40 grams of NMP | Emission $\lambda_{max}$ | 590 | 597 |
| 10 | 0.1555 grams Rhodamine B | Visible $\lambda_{max}$ | 561 | 530 |
|   | 0.1667 grams of polystyrene | Excitation $\lambda_{max}$ | 530 | 530 |
|   | 40 grams of NMP | Emission $\lambda_{max}$ | 590 | 586 |
| 11 | 0.1458 grams of Rhodamine B (control) | Visible $\lambda_{max}$ | 561 | 527 |
|   | 40 grams of NMP | Excitation $\lambda_{max}$ | 530 | 530 |
|   |  | Emission $\lambda_{max}$ | 590 | 592 |
| 12 | 0.1163 grams of Coumarin 334 | Visible $\lambda_{max}$ | 454 | 381 |
|   | 0.1282 grams of poly(phenyl sulfone) | Excitation $\lambda_{max}$ | 456 | 374 |
|   | 30 grams of NMP | Emission $\lambda_{max}$ | 499 | 530 |
| 13 | 0.1074 grams of Coumarin 334 (control) | Visible $\lambda_{max}$ | 454 | 455 |
|   | 30 grams of NMP | Excitation $\lambda_{max}$ | 440 | 440 |
|   |  | Emission $\lambda_{max}$ | 499 | 578 |
| 14 | 0.1310 grams of Coumarin 334 | Visible $\lambda_{max}$ | 444 | 377 |
|   | 0.1306 grams of polysulfone | Excitation $\lambda_{max}$ | 440 | 374 |
|   | 40 grams of tetrahydrofuran | Emission $\lambda_{max}$ | 481 | 532 |

All solution samples were run in 10×10 mm cuvettes for absorbance and photoluminescence. The liquid samples were diluted with the appropriate solvent to bring the absorbance maximum in the visible to less than 0.8 a.u. to remove nonlinear distortions in both the absorbance and photoluminescence signals.

Absorbance spectra were obtained with a Hitachi U-3110 spectrophotometer. Bandpass was 2 nm, scan speed was 300 nm/min, scan interval was 2 nm. A cuvette with the appropriate solvent was placed in the reference beam for liquid ohms) had conductive silver paste (colloidal silver paste from Ted Pella, Inc.) applied to opposite ends (75 mm apart) on the ITO coated slide of ~0.5 cm². After solidification of the silver paste, the slide was placed in a spin bowl apparatus (Laurell Model WS-400-8FTM-Full/HPD) and cleaned with isopropanol while spinning. A solution of Baytron P (3,4polyethylenedioxythiophene-polystyrene sulfonate (CAS #1555090-83-8)) solution in water (1.3 wt % solids) was obtained from Bayer and filtered through a 1μ filter and applied to the ITO coated glass slide surface and spun at 2000 rpm for 45 seconds. The sample was allowed to dry and then approximately 1 ml of a solution of 0.4179 grams of Rhodamine B, 0.4152 grams of polysulfone (P-1700 from Amoco), and 40 grams of $CHCl_3$ was applied to the coated glass slide at 1000 rpm. The sample was then masked and Al cathode sections were applied via thermal vacuum evaporation. The ends of the Al cathodes were coated with the conductive silver paste noted above. After drying and setting in a laboratory for several weeks (50% RH, 23° C.), the anode and cathodes were connected to a voltage source and 20 volts and 40 volts were applied across the device.

Light emission was observed which was quite intense at 40 volts. Light emission was only observed over the Al area coated with the conductive silver paste. Later analysis indicated the Al cathode thickness was too low to yield conductivity where the paste was not applied.

Example 16

LED Device Fabrication

An unpolished float glass $SiO_2$ slide (50×75×1.1 mm) coated on one side with indium tin oxide (resistance=8–12 ohms) was exposed to ozone for 20 minutes and then had conductive silver paste (colloidal silver paste from Ted Pella, Inc.) applied to opposite ends (75 mm apart) on the ITO coated slide of ~0.5 cm². After solidification of the silver paste, the slide was placed in a spin bowl apparatus (Laurell Model WS-400-8FTM-Full/HPD). Approximately 1 ml of a solution of 0.2550 grams of Coumarin 6 and 0.2410 grams of PAE-2 dissolved in 40 grams of cyclopentanone (filtered through a 0.45µ filter) was spin coated onto the glass slide (1000 rpm for 45 sec.).

Example 17

LED Fabrication

An unpolished float glass $SiO_2$ slide (50×75×1.1 mm) coated on one side with indium tin oxide (resistance=8–12 ohms) was exposed to ozone for 20 minutes and then had conductive silver paste (colloidal silver paste from Ted Pella, Inc.) applied to opposite ends (75 mm apart) on the ITO coated slide of ~0.5 cm². After solidification of the silver paste, the slide was placed in a spin bowl apparatus (Laurell Model WS-400-8FTM-Full/HPD). A solution of Baytron P (3,4 polyethylenedioxythiophene-polystyrene sulfonate (CAS #1555090-83-8)) solution in water (1.3 wt % solids) was obtained from Bayer, diluted with an equal volume of distilled water and filtered through a 1µ filter and applied to the ITO coated glass slide surface and spun at 1000 rpm for 45 seconds. The glass slide was then heated at 125° C. for 5 minutes (under glass covers) in an air-circulating oven. After cooling, approximately 1 ml of a solution of 0.1705 grams of Rhodamine B and 0.1520 grams of PAE-2 dissolved in 30 grams of cyclopentanone (filtered through a 0.45µ filter) was spin coated on the glass slide at 1000 rpm for 45 seconds. The sample was recoated with another 1 ml of the above solution for 45 sec at 1000 rpm.

Example 18

LED Fabrication

An unpolished float glass $SiO_2$ slide (50×75×1.1 mm) coated on one side with indium tin oxide (resistance=8–12 ohms) was exposed to ozone for 20 minutes and then had conductive silver paste (colloidal silver paste from Ted Pella, Inc.) applied to opposite ends (75 mm apart) on the ITO coated slide of ~0.5 cm². After solidification of the silver paste, the slide was placed in a spin bowl apparatus (Laurell Model WS-400-8FTM-Full/HPD). Approximately 1 ml of a solution of 0.1705 grams of Rhodamine B and 0.1520 grams of PAE-2 dissolved in 30 grams of cyclopentanone (filtered through a 0.45µ filter) was spin coated on the glass slide at 1000 rpm for 45 seconds.

Example 19

Demonstration of Thin Film Characteristics

A sample of Example 14 (0.1310 grams Coumarin 334/0.1306 grams of polysulfone/40 grams of tetrahydrofuran) was cast in a Petri dish and devolatilized at room temperature. The resultant film, which had good adhesion to glass, was removed by immersion in water. The very thin film had mechanical strength even though it was less than 50 wt. % of the polymer. A dynamic mechanical analysis showed a glass transition temperature of approximately 50° C. with a clear indication that residual solvent (THF) was left in the film. Thus the dry film would have a $T_g$>50° C. The observation that the film was transparent, amorphous and had mechanical durability indicates that the combinations of high $T_g$ polymers with high loading of electroluminescent low molecular weight compounds are quite suitable for FOLED fabrication processes.

Example 20

Determination of $T_g$ of Polymer/Fluorescent Material Blend

A sample of 2 grams of polysulfone (P-3500) (obtained from Amoco) and 1 gram of Coumarin 6 (obtained from Aldrich) were dissolved in 30 grams of tetrahydrofuran followed by devolatilization. The devolatilized film was compression molded at 210–220° C. A sample of 3 grams of polysulfone (P-3500, Amoco) was also dissolved in 30 grams of tetrahyudrofuran and devolatilized and compression molded at 230–240° C. The samples were submitted for dynamic mechanical analysis using a Rheometrics Solid Analyzer (RSA II) with a deformation frequency of 6.28 rad/sec. The $T_g$ of the polysulfone was found to be initially 146° C. (indicating residual THF in the sample) which when fully devolatilized gave a $T_g$ of 190° C., and the polysulfone/Coumarin 6 (2/1 blend) $T_g$ was 132° C. The blend was transparent and appeared to be quite miscible.

The DSC results on the above blend were determined at a heating and cooling rate of 10° C./min.

The calorimetry results on the polysulfone/Coumarin 6 (2/1) blend cast from tetrahydrofuran are listed below:

Coumarin 6 Control
1st heating: $T_m$=211.3° C.; $\Delta H_f$=109.8 J/g
1st cooling: $T_c$=184.0° C.; $\Delta H_c$=87.6 J/g
2nd heating: $T_m$=211.8° C.; $\Delta H_f$=94.9 J/g Polysulfone Control
1st heating: $T_g$=142.5° C.
1st cooling: $T_g$=166.2° C.
2nd heating: $T_g$=169.8° C.

Polysulfone/Coumarin 6 (2/1) Blend
1st heating: $T_g$=100.4° C.; $T_c$=159.3; $\Delta H_c$=16.3 J/g; $T_m$=190.7° C.; $\Delta H_f$=18.2 J/g 1st cooling: $T_g$=107.0° C.
2nd heating: $T_g$=110.4° C.; $T_c$=183.3° C.; $\Delta H_c$=0.75 J/g; $T_m$=197.0° C.; $\Delta H_f$=0.82 J/g The DSC results also show the depression of the polysulfone $T_g$ due to residual THF. The cooling data and 2nd heating data show an increased $T_g$ due to THF devolatilization from the sample. The polysulfone/Coumarin 6 blend sample shows the sample is amorphous as prepared but crystallizes during the temperature excursion of calorimetry testing when the temperature exceeds the $T_g$ of the blend. The cooling curve does not exhibit any Coumarin 6 crystallization for the blend but prominent crystallization for the control Coumarin 6. The 2nd heating curve shows a very modest level of Coumarin 6 crystallization when heated well above the sample $T_g$. A rapid devolatilization of solvent from a polysulfone/Coumarin 6 blend will result in an amorphous thin film with a $T_g$ well above the values noted to offer problems (~75° C.) for LED applications. The DMA and DSC results clearly demonstrate that the laser dyes (e.g., Coumarin 6) show greatly depressed crystallization rates with incorporation in high $T_g$ polymers such as polysulfone.

Example 21

A solution was prepared by dissolving 35.5 mg of PAE-2, 16.2 mg of N,N'-Bis(3-methylphenyl)-N,N'-diphenylbenzidine (TPD, CAS #65181-78-4), and 0.9 mg of Coumarin 6 (CAS #38215-36-0) in 2.61 grams of chlorobenzene. A polished soda lime float glass (2.5×2.5×0.7 cm) coated on one side with indium tin oxide (sheet resistance ≦15 ohms per square) was cleaned by ultrasonication sequentially in detergent, de-ionized water, methanol, isopropanol, and acetone; each for 5 min. The ITO coated glass substrate was allowed to dry between different solvents. After being exposed to UV-ozone for 10 min, the ITO glass substrate was placed on the chuck of a Laurell Model WS-400-N6PP spinner and the solution was applied to it at a spin rate of 1200 rpm. The sample was then masked and Mg/Ag layers were sequentially deposited via thermal vacuum evaporation at a pressure less than $1\times10^{-5}$ Torr. Under forward bias (ITO connected to positive and Ag connected to negative electrode), green light emission was observed above 14 V and became very bright at 25 V. FIG. 1 shows the current-voltage characteristic of the device.

Example 22

Figure 2:
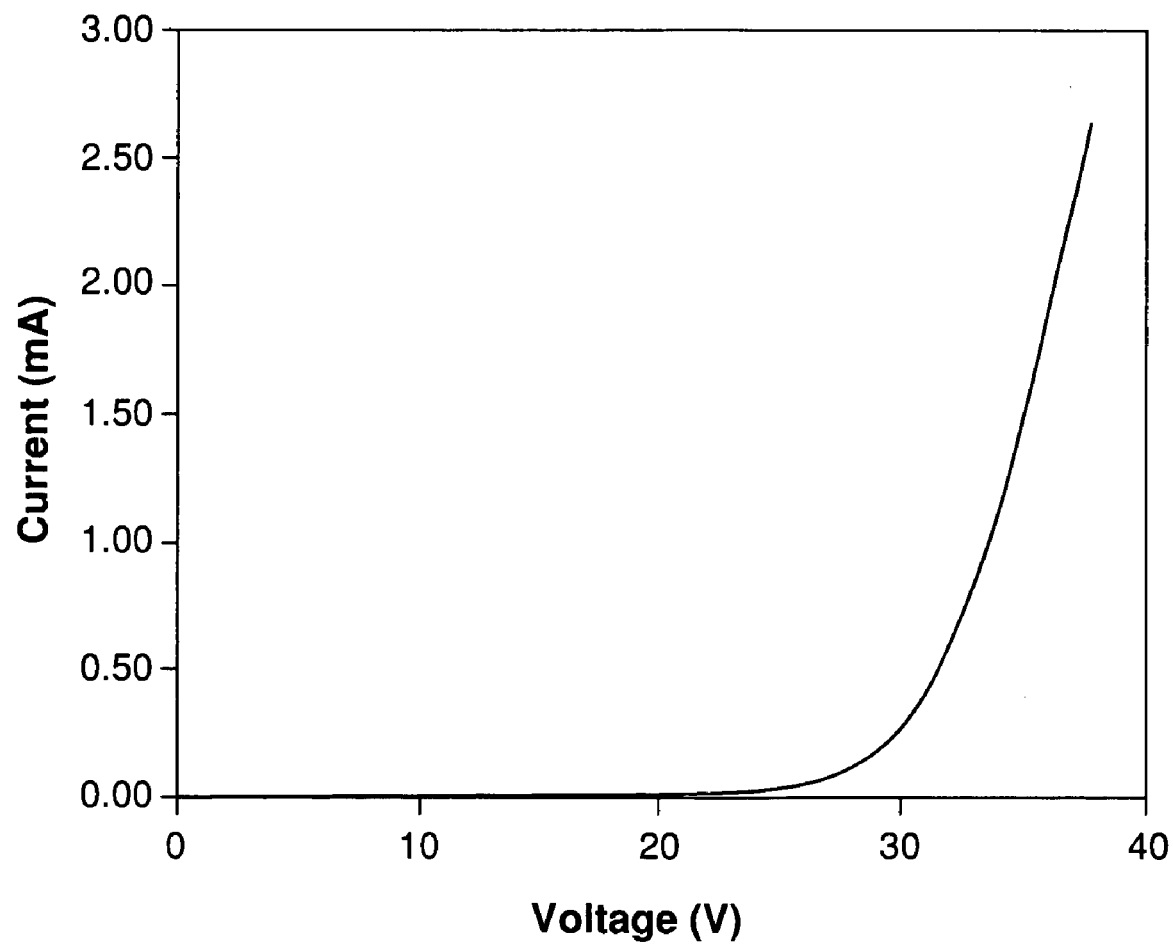
FIG. 2 is a graph of the current-voltage characteristic of Example 22.

A solution was prepared by dissolving 35.4 mg of PAE-2, 16.0 mg of 2-(4-biphenylyl)-5-(4-tert-butylphenyl)-1,3,4-oxadiazole (PBD, CAS #15082-28-7) and 0.8 mg of Coumarin 6 (CAS #38215-36-0) in 2.59 grams of chlorobenzene. A polished soda lime float glass (2.5×2.5×0.7 cm) coated on one side with indium tin oxide (sheet resistance ≦15 ohm per square) was cleaned by ultrasonication sequentially in detergent, de-ionized water, methanol, isopropanol, and acetone; each for 5 min. The ITO coated glass substrate was allowed to dry between different solvents. After being exposed to UV-ozone for 10 min, the ITO glass substrate was placed on the chuck of a Laurell Model WS-400-N6PP spinner and the solution was applied to it at a spin rate of 1200 rpm. The sample was then masked and Mg/Ag layers were sequentially deposited via thermal vacuum evaporation at a pressure less than $1\times10^{-5}$ Torr. Under forward bias (ITO connected to positive and Ag connected to negative electrode), green light emission was observed above 22 V and became very intense at 38 V. FIG. 2 shows the current-voltage characteristic of the device.

Example 23

Figure 3:
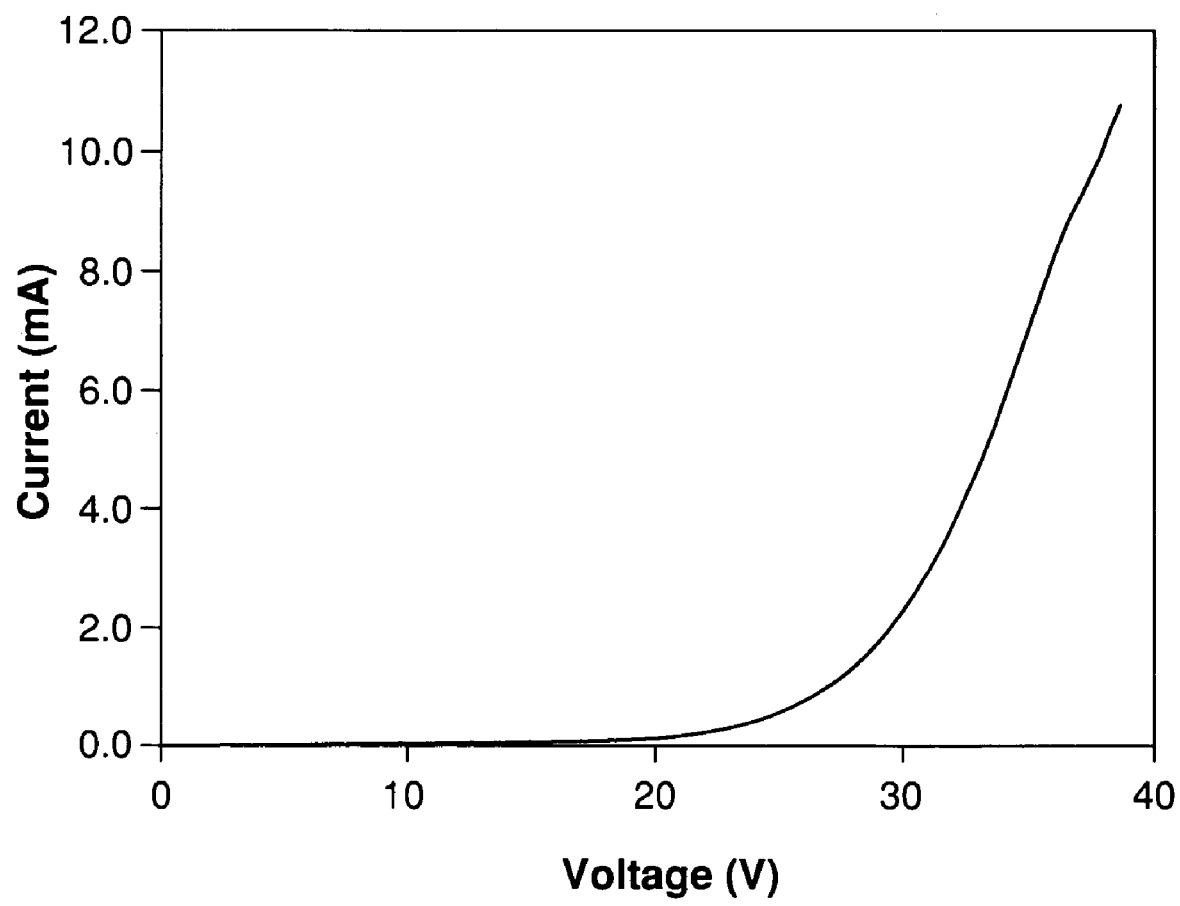
FIG. 3 is a graph of the current-voltage characteristic of Example 23.

A solution was prepared by dissolving 20.4 mg of PAE-2, 5.3 mg of N,N'-Bis(3-methylphenyl)-N,N'-diphenylbenzidine (TPD, CAS #65181-78-4), 6.5 mg of 2-(4-biphenylyl)-5-(4-tert-butylphenyl)-1,3,4-oxadiazole (PBD, CAS #15082-28-7) and 0.8 mg of Coumarin 6 (CAS #38215-36-0) in 1.60 grams of chlorobenzene. A polished soda lime float glass (2.5×2.5×0.7 cm) coated on one side with indium tin oxide (resistance ≦15 ohms per square) was cleaned by ultrasonication sequentially in detergent, de-ionized water, methanol, isopropanol, and acetone; each for 5 min. The ITO coated glass substrate was allowed to dry between different solvents. After being exposed to UV-ozone for 10 min, the ITO glass substrate was placed on the chuck of a Laurell Model WS-400-N6PP spinner and the solution was applied to it at a spin rate of 1200 rpm. The sample was then masked and Mg/Ag layers were sequentially deposited via thermal vacuum evaporation at a pressure less than $1\times10^{-5}$ Torr. Under forward bias (ITO connected to positive and Ag connected to negative electrode), green light emission was observed above 18 V and became very bright at 38 V. FIG. 3 shows the current-voltage characteristic of the device.

Example 24

Figure 4:
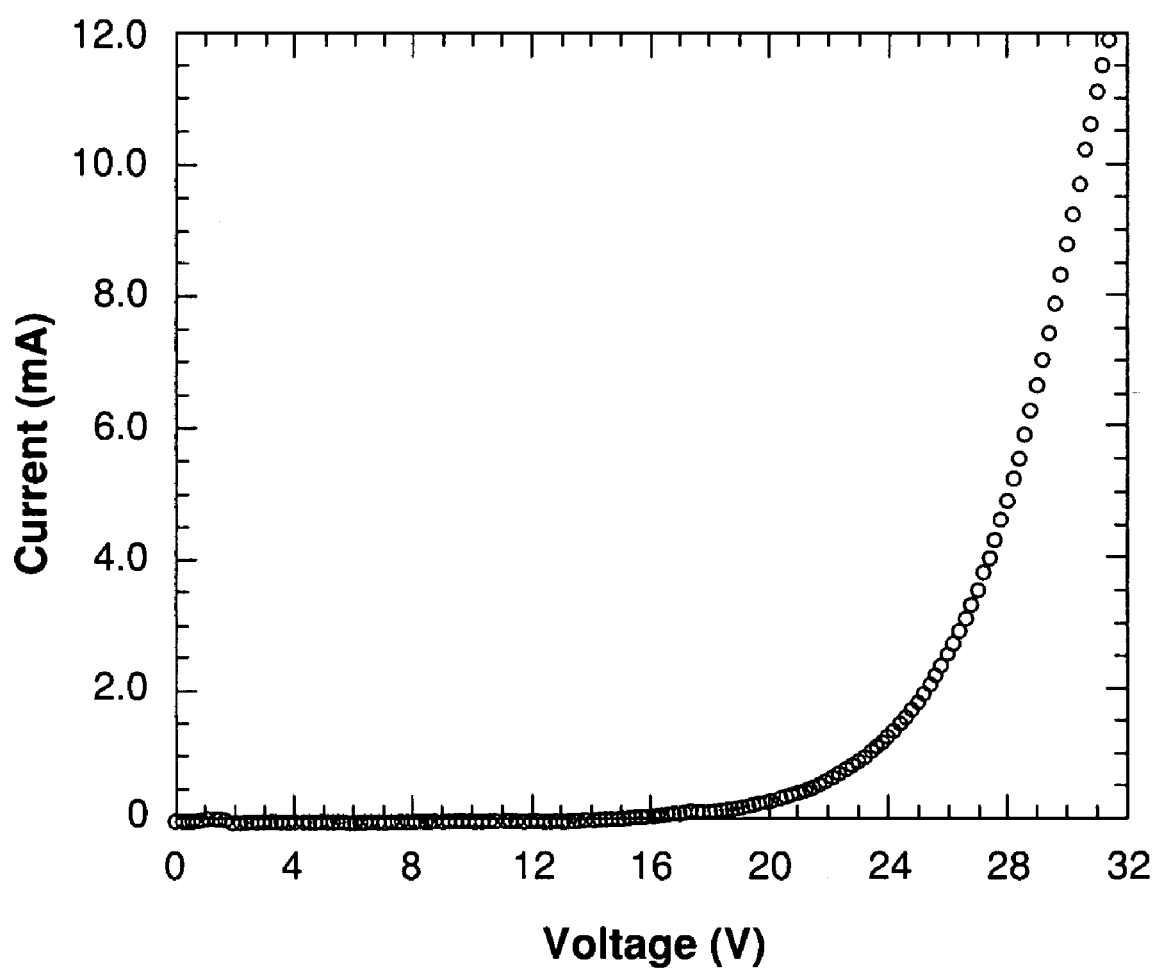
FIG. 4 is a graph of the current-voltage characteristic of Example 24.

A solution was prepared by dissolving 19.7 mg of PAE-2, 7.8 mg of 4-(Dicyanomethylene)-2-methyl-6-(4-dimethylaminostyryl)-4H-pyran (DCM, from Aldrich, CAS #51325-91-8) in 1.0781 g of chlorobenzene and filtered with a 0.2 μm hydrophobic filter. A polished soda lime float glass (2.5×2.5×0.7 cm) coated on one side with indium tin oxide (resistance ≦15 ohms per square) was cleaned by ultrasonication sequentially in detergent, de-ionized water, methanol, isopropanol, and acetone; each for 5 min. The ITO coated glass substrate was allowed to dry between different cleaning solvents. After being exposed to UV-ozone for 10 min, the ITO glass substrate was placed on the chuck of a Laurell Model WS-400-N6PP spinner and a water based dispersion of poly(3,4-ethylenedioxythiophene):polystyrene sulfonic acid (PEDOT, diluted from the original solid contents of about 1.3 wt % of Baytron P from Bayer Corporation to ~0.5 wt % using de-ionized water) was applied to it at a spin rate of 1200 rpm. Then the PEDOT coated sample was put in a vacuum oven (~25 mmHg) and annealed at 80° C. for 10 min. After that, the annealed sample was placed on the chuck of the spinner and the solution of PAE-2:DCM was applied to it at a spin rate of 1200 rpm. Finally the sample was masked and Mg/Ag layer were sequentially deposited via thermal vacuum evaporation at a pressure less than $1\times10^{-5}$ Torr. Under forward bias (ITO connected to positive and Ag connected to negative electrode), red light emission was observed above 18 V and became very bright at 30 V. FIG. 4 shows the current-voltage characteristic of the device. The current of the device was reasonably high, suggesting that the blending ratio of DCM (28.4 w % of the PAE-2:DCM film) had reached the percolation ratio needed for conducting current.

Example 25

Four solutions of Coumarin 6 (CAS #38215-36-0) doped blends of PAE-2 and hole transporting material N,N'-Bis(3-methylphenyl)-N,N'-diphenylbenzidine (TPD, CAS #65181-78-4) were prepared as follows. Solution 1: 19.0 mg of PAE-2 and 1.0 mg of TPD plus 0.3 mg of Coumarin 6 dissolved in 1.00 g of chlorobenzene. Solution 2: 18.0 mg of PAE-2 and 2.0 mg of TPD plus 0.3 mg of Coumarin 6 dissolved in 1.00 g of chlorobenzene. Solution 3: 17.0 mg of PAE-2 and 3.0 mg of TPD plus 0.3 mg of Coumarin 6 dissolved in 1.00 g of chlorobenzene. Solution 4: 16.0 mg of PAE-2 and 4.0 mg of TPD plus 0.3 mg of Coumarin 6 dissolved in 1.00 g of chlorobenzene. The blending ratios of TPD in Solution 1, 2, 3 and 4 were 5 wt %, 10 wt %, 15 wt %, and 20 wt %, respectively. The solutions were filtered with a 0.2 micron hydrophobic filter.

Figure 5:
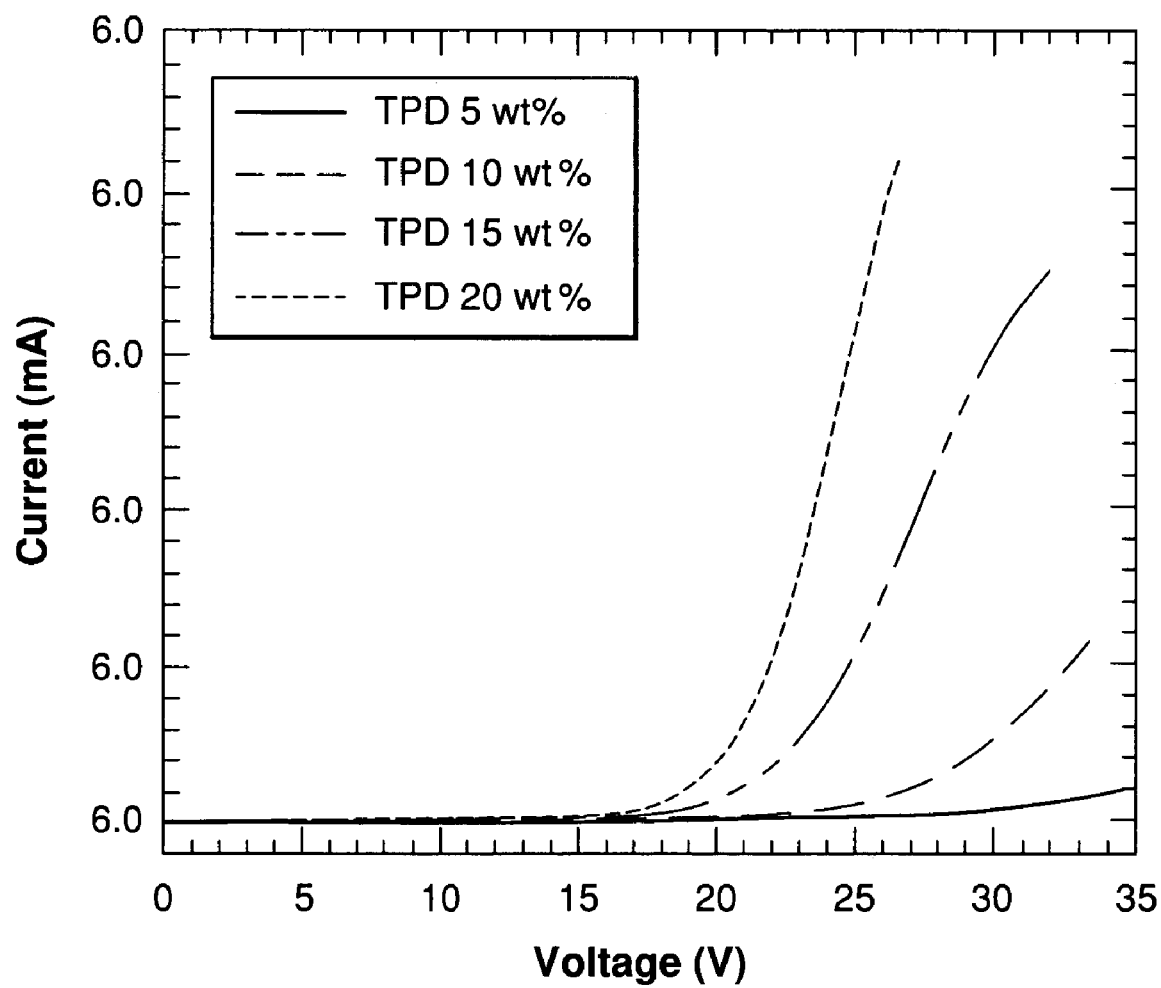
FIG. 5 is a graph of the current-voltage characteristic of Example 25.

Four polished soda lime float glass (2.5×2.5×0.7 cm) substrates coated on one side with indium tin oxide (resistance less than 15 ohm/square) were cleaned by ultrasonication sequentially in detergent, de-ionized water, methanol, isopropanol, and acetone; each for 5 min. The ITO coated glass substrates were allowed to dry between different cleaning solvents. After being exposed to UV-ozone for 10 min, the ITO glass substrates were placed on the chuck of a Laurell Model WS-400-N6PP spinner and the solutions were applied to them at a spin rate of 1200 rpm, one solution on one substrate. The samples were then masked and Mg/Ag layers were sequentially deposited via thermal vacuum evaporation at a pressure less than $1\times10^{-5}$ Torr. Under forward bias (ITO connected to positive and Ag connected to negative electrode), green light emission was observed. FIG. 5 shows the current-voltage characteristics of the four devices. As the weight ratio of TPD increased to 15 wt %, the current passed through the device dramatically increased. Hence the percolation threshold of TPD in PAE-2 is around 15 wt %.

Example 26

Figure 6:
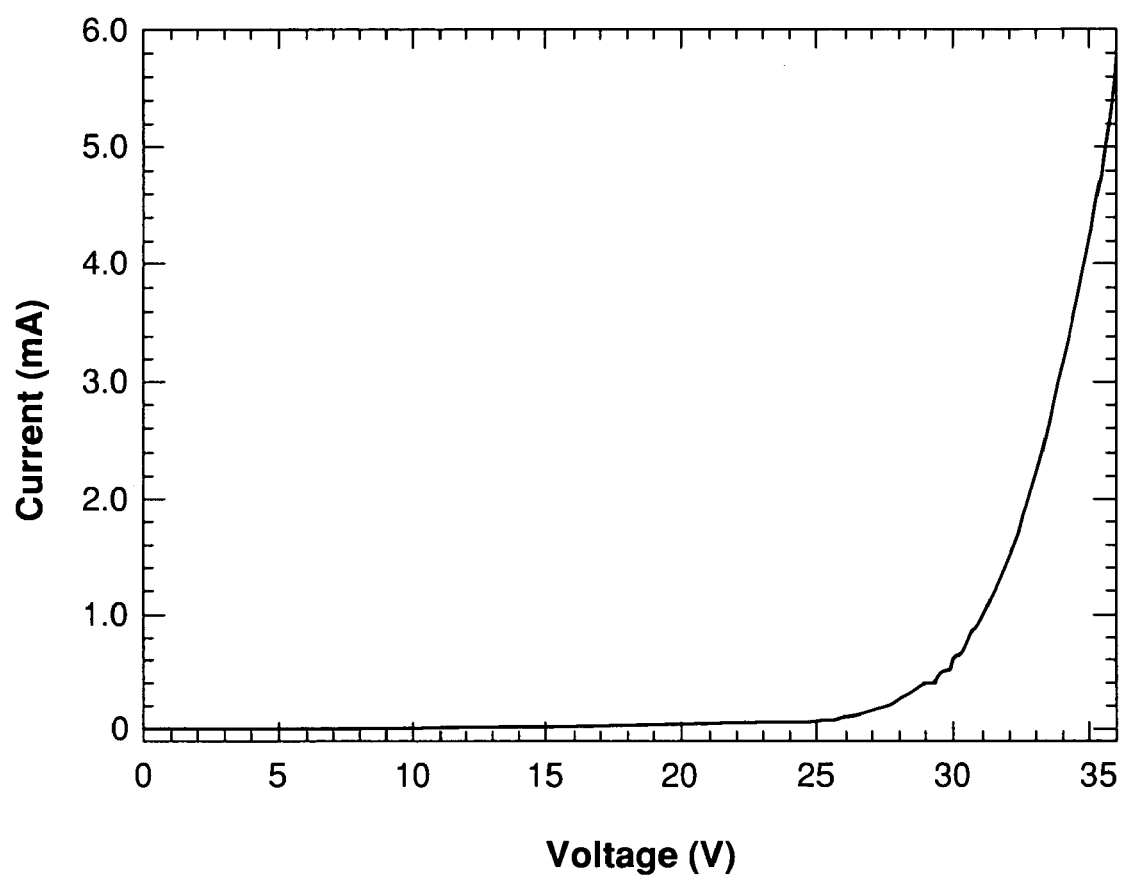
FIG. 6 is a graph of the current-voltage characteristic of Example 26.

A solution was prepared by dissolving 15.5 mg of poly (2,6-dimethyl-1,4-phenylene oxide), 5.9 mg of N,N'-Bis(3-methylphenyl)-N,N'-diphenylbenzidine (TPD, CAS #65181-78-4), and 0.3 mg of Coumarin 6 (CAS #38215-36-0) in 1.00 grams chlorobenzene. The solution was filtered with a 0.2 micron hydrophobic filter. A polished soda lime float glass (2.5×2.5×0.7 cm) coated on one side with indium tin oxide (resistance less than 15 ohm/square) was cleaned by ultrasonication sequentially in detergent, de-ionized water, methanol, isopropanol, and acetone; each for 5 min. The ITO coated glass substrate was allowed to dry between different cleaning solvents. After being exposed to UV-ozone for 10 min, the ITO glass substrate was placed on the chuck of a Laurell Model WS-400-N6PP spinner and the solution was applied to it at a spin rate of 1200 rpm. The sample was then masked and Mg/Ag layers were sequentially deposited via thermal vacuum evaporation at a pressure less than $1\times10^{-5}$ Torr. The active area of the device was about 6 mm². Under forward bias (ITO connected to positive and Ag connected to negative electrode), light emission was observed above 25 V. FIG. 6 shows the current-voltage characteristic of the device.

While the invention has been described in detail and with reference to specific examples thereof, it will be apparent to one skilled in the art that various changes and modifications can be made therein without departing from the spirit and scope thereof.

The invention claimed is:

1. A method for manufacturing a light emitting device comprising:
    providing a light emitting layer comprising an electroluminescent organic material dispersed in a matrix, wherein the electroluminescent organic material has a molecular weight less than about 2000 amu, the matrix comprises a non-electroluminescent organic polymer having a $T_g$ of at least 170° C., and each of the non-electroluminescent organic polymer and the electroluminescent organic material constitutes at least 20 percent by weight of the light emitting layer; and
    providing electrodes in electrical communication with the light emitting layer, wherein the electrodes are configured to conduct an electric charge through the light emitting layer such that the light emitting layer emits light.

2. The method of claim 1, wherein the light emitting layer providing comprises at least one thin layer fabrication technique selected from the group consisting of spin coating, screen printing, ink jet printing and roll-to-roll printing.

3. The method of claim 2, wherein one of the electrodes is an anode and the other of the electrodes is a cathode, the anode is provided on a first side of the light emitting layer, the cathode is provided on a second side of the light emitting layer, and a transparent substrate is provided on a side of the anode facing away from the light emitting layer.

4. The method of claim 3, further comprising providing a hole transport layer between the anode and the light emitting layer and an electron transport layer between the light emitting layer and the cathode.

5. The method of claim 4, wherein the hole transport layer providing comprises at least one thin layer fabrication technique selected from the group consisting of spin coating, spray coating, meniscus coating, ink jet printing, roll-top-roll processing screen printing, sputtering, evaporative coating and vacuum deposition.

6. The method of claim 5, wherein the electron transport layer providing comprises at least one thin layer fabrication technique selected from the group consisting of vacuum deposition, spin coating, screen printing, ink jet printing and roll-to-roll printing.

7. The method of claim 6, wherein the providing of the electrodes comprises at least one member selected from the group consisting of sputtering, screen printing, ink jet printing, roll-to-roll printing, thermal vacuum evaporation and thermal vacuum deposition.

8. The method of claim 4, wherein the light emitting layer, the hole transport layer and the electron transport layer are provided by printing.

9. The method of claim 2, wherein the non-electroluminescent organic polymer is a poly(arylene ether).

10. The method of claim 9, wherein the poly(arylene ether) comprises repeating units of the structure:

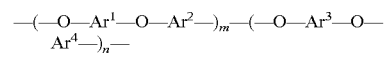

wherein m is 0 to 1, n is 1-m and $Ar^1$, $Ar^2$, $Ar^3$ and $Ar^4$ are independently divalent arylene radicals.

11. The method of claim 10, wherein $Ar^1$, $Ar^2$, $Ar^3$ and $Ar^4$ are divalent arylene radicals independently selected from the group consisting of:

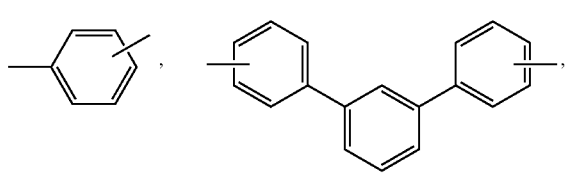

-continued

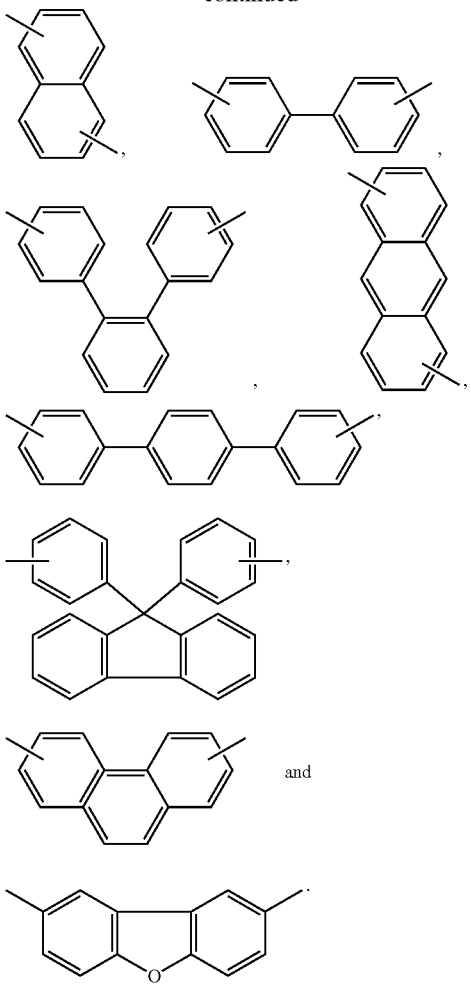

provided that $Ar^1$, $Ar^2$, $Ar^3$ and $Ar^4$ cannot be isomeric equivalents other than diradical 9,9-diphenylfluorene.

12. The method of claim 10, wherein m is 0.5 and n is 0.5.

13. The method of claim 10, wherein m is 1 and $Ar^1$ is biphenyl radical.

14. The method of claim 2, wherein the non-electroluminescent organic polymer is poly-2,6-dimethyl-1,4-phenyleneoxide.

15. The method of claim 2, wherein the $T_g$ of the non-electroluminescent organic polymer is at least 200° C.

16. The method of claim 2, wherein the non-electroluminescent organic polymer constitutes not more than 50 percent by weight of the light emitting layer.

17. The method of claim 2, wherein the electroluminescent organic material constitutes at least 50 percent by weight of the light emitting layer.

18. The method of claim 2, wherein the electroluminescent organic material is at least one member selected from the group consisting of distyrenyl derivatives, Coumarin 6, Coumarin 334, Coumarin 343, Rhodamine B, Rhodamine 6G, Rhodamine 110, Fluorescein 548, 2',7'-dichlorofluorescein, cresyl violet perchlorate, Nile Blue AA perchlorate, p-terphenyl, p-quaterphenyl, Exalite (376, 384r, 389), Fluorol 555, Fluorescein Diacetate, Carbostyril 165, IR-140, Thionin, perylene, 9-amino acridine HCl and aromatic methylidine compounds of the general structure:

$$R^1R^2C=CH-Ar-CH=CR^3R^4$$

where Ar is an aromatic structure, and $R^1$, $R^2$, $R^3$, and $R^4$ independently represent hydrogen, alkyl groups, alkoxy groups, aromatic groups including substituted aromatic groups or cycloaliphatic groups.

19. The method of claim 2, wherein the electroluminescent organic material is at least one member selected from the group consisting of naphthalene derivatives, anthracene derivatives, phenanthrenes, perylenes, chrysenes, butadienes, periflanthenes and tetravinylpyrazines.

20. The method of claim 2, wherein the light emitting device is provided with sufficient flexibility to be contoured around a cylinder with a radius of six inches without fracture or loss of light emitting capabilities.

* * * * *